(12) United States Patent
Mizota et al.

(10) Patent No.: US 7,678,199 B2
(45) Date of Patent: Mar. 16, 2010

(54) SUBSTRATE CLEANING METHOD

(75) Inventors: Shogo Mizota, Hillsboro, OR (US); Minami Teruomi, Kurume (JP); Kenji Yokomizo, Austin, TX (US); Taira Masaki, Kurume (JP)

(73) Assignee: Tokyo Electron Limited, Tokyo (JP)

( * ) Notice: Subject to any disclaimer, the term of this patent is extended or adjusted under 35 U.S.C. 154(b) by 729 days.

(21) Appl. No.: 11/470,353

(22) Filed: Sep. 6, 2006

(65) Prior Publication Data

US 2008/0053489 A1 Mar. 6, 2008

(51) Int. Cl.
*B08B 3/04* (2006.01)

(52) U.S. Cl. .............................. 134/2; 134/10; 134/13; 134/25.1; 134/25.4; 134/26; 134/32; 134/33; 134/34; 134/42; 134/95.1; 134/95.2; 134/95.3; 134/99.1; 134/99.2; 134/186; 134/902; 210/805

(58) Field of Classification Search ............ 134/2, 134/10, 13, 25.1, 25.4, 26, 32, 33, 42, 95.1, 134/95.2, 95.3, 99.1, 99.2, 186, 902, 34; 210/805

See application file for complete search history.

(56) References Cited

U.S. PATENT DOCUMENTS

| | | | |
|---|---|---|---|
| 6,247,479 B1 | 6/2001 | Taniyama et al. | |
| 6,861,371 B2 | 3/2005 | Kamikawa et al. | |
| 6,863,741 B2 | 3/2005 | Orii et al. | |
| 6,979,655 B2 | 12/2005 | Niuya et al. | |
| 6,990,988 B2 | 1/2006 | Fujishima | |
| 2001/0013555 A1 | 8/2001 | Egashira et al. | |
| 2002/0029852 A1* | 3/2002 | Egashira | 156/345 |
| 2002/0170571 A1* | 11/2002 | Egashira et al. | 134/1.3 |
| 2003/0084929 A1 | 5/2003 | Kamikawa et al. | |
| 2004/0002214 A1 | 1/2004 | Mizutani et al. | |
| 2004/0009669 A1 | 1/2004 | Sonoda et al. | |
| 2006/0046413 A1* | 3/2006 | Edamoto | 438/366 |
| 2006/0151007 A1 | 7/2006 | Bergman | |
| 2008/0053489 A1* | 3/2008 | Mizota et al. | 134/33 |

OTHER PUBLICATIONS

European Patent Office, International Search Report and Written Opinion received in corresponding PCT Application No. PCT/US2007/076734 dated Feb. 12, 2008, 8 pgs.

\* cited by examiner

*Primary Examiner*—Sharidan Carrillo
(74) *Attorney, Agent, or Firm*—Wood, Herron & Evans, LLP

(57) ABSTRACT

A method is provided for reducing the amount of film fragments discharged into a processing liquid circulation system during removal of films from wafers, thereby reducing the frequency of filter cleaning or filter replacement. The method includes exposing a wafer containing a film formed thereon in a process chamber of a substrate processing system to a processing liquid, where the wafer is not rotated or is rotated at a first speed and the processing liquid is discharged from the process chamber to a processing liquid circulation system. Subsequently, exposure of the wafer to the processing liquid is discontinued and the wafer is rotated at a second speed greater than the first speed to centrifugally remove fragments of the film from the wafer. Next, the wafer is exposed to the same or a different processing liquid and the processing liquid is discharged from the process chamber to a processing liquid drain.

17 Claims, 13 Drawing Sheets

SUBSTRATE CLEANING METHOD

FIELD OF THE INVENTION

The present invention relates to a substrate cleaning method, and more particularly, to a method for removing a film from a substrate, where the amount of film fragments in processing liquids used for removing the film is minimized, thereby reducing the frequency of filter cleaning or filter replacement.

BACKGROUND OF THE INVENTION

Substrate processing systems that subject semiconductor substrates (e.g., wafers) to various cleaning processes in semiconductor device fabrication often include processing liquid recovery systems configured for recovering and reusing the normally expensive processing liquids for processing additional substrates. The processing liquid recovery systems usually include one or more filters for removing film fragments and other impurities from the processing liquids prior to processing additional substrates.

For example, when a patterned resist film on a substrate is exposed to a processing liquid containing an organic solvent in order to dissolve and remove the patterned resist film from the substrate, the patterned resist film may only partially dissolve in the processing liquid but form film fragments that detach from the substrate and become suspended in the processing liquid. Next, the processing liquid and the film fragments are flowed through the processing liquid recovery system where the film fragments and other impurities are removed from the processing liquid.

However, due to the large number of wafers normally cleaned in conventional substrate processing systems and the often large amount of film fragments that become suspended in the processing liquids, the one or more filters used for filtering the processing liquid in the processing liquid recovery system may quickly become clogged, thereby hindering flow of the processing liquid through the one or more filters. This requires frequent cleaning or replacing of the one or more filters, which in turn interrupts the wafer processing, results in decreased wafer throughput, and increases the cost of operating the substrate processing system.

SUMMARY OF THE INVENTION

According to one embodiment of the invention, a method is provided for removing a film from a wafer using a processing liquid, where the method reduces the amount of film fragments discharged into a processing liquid circulation system, thereby decreasing the frequency of filter cleaning or filter replacement.

According to one embodiment of the invention, the method includes (a) exposing a wafer to a first processing liquid, where the wafer is not rotated or is rotated at a first speed and the first processing liquid is discharged from the process chamber to a first processing liquid circulation system; (b) discontinuing the exposing of the wafer to the first processing liquid, and rotating the wafer at a second speed greater than the first speed to centrifugally remove fragments of the film from the wafer; and (c) exposing the wafer to the first processing liquid or a second processing liquid, where the respective first or second processing liquid is discharged from the process chamber to a processing liquid drain.

According to another embodiment of the invention, the method includes exposing the wafer to a second processing liquid in step (c) and discharging the second processing liquid from the process chamber to the processing liquid drain, and then (d) exposing the wafer to the first processing liquid and discharging the first processing liquid from the process chamber to the first processing liquid circulation system.

According to yet another embodiment of the invention, the method includes exposing the wafer to a second processing liquid in step (c) and discharging the second processing liquid from the process chamber to the processing liquid drain, and then (d) exposing the wafer to the second processing liquid and discharging the second processing liquid from the process chamber to a second processing liquid circulation system.

BRIEF DESCRIPTION OF THE DRAWINGS

The accompanying drawings, which are incorporated in and constitute a part of this specification, illustrate embodiments of the invention and, together with a general description of embodiments of the invention given above, and the detailed description given below, serve to explain embodiments of the invention.

DETAILED DESCRIPTION OF SEVERAL EMBODIMENTS

Embodiments of the present invention are explained below using a substrate processing system for removing a film from a wafer in a substrate cleaning process. The terms "substrate" and "wafer" are used interchangeably herein to refer to a thin slice of material, such as a silicon crystal or glass material, upon which microcircuits are constructed, for example by diffusion and deposition of various materials. The film can, for example, contain a resist film, a hard mask film, a dielectric film, or a combination of two or more thereof.

FIGS. 1-4 describe a substrate processing system containing four substrate units, each configured for processing a single wafer at a time. However, embodiments of the invention are not limited to single substrate processing systems, as batch substrate processing systems configured for processing simultaneously a plurality of substrates (e.g., 25 wafers or more) may be utilized. An exemplary batch substrate processing system is described in U.S. Pat. No. 6,990,988. In one example, the batch substrate processing system may be a TEL PR300Z from Tokyo Electron Limited, Akasaka, Japan, that is commonly used for stripping photoresist from 12 inch wafers for back end of line (BEOL) processing.

Figure 1:
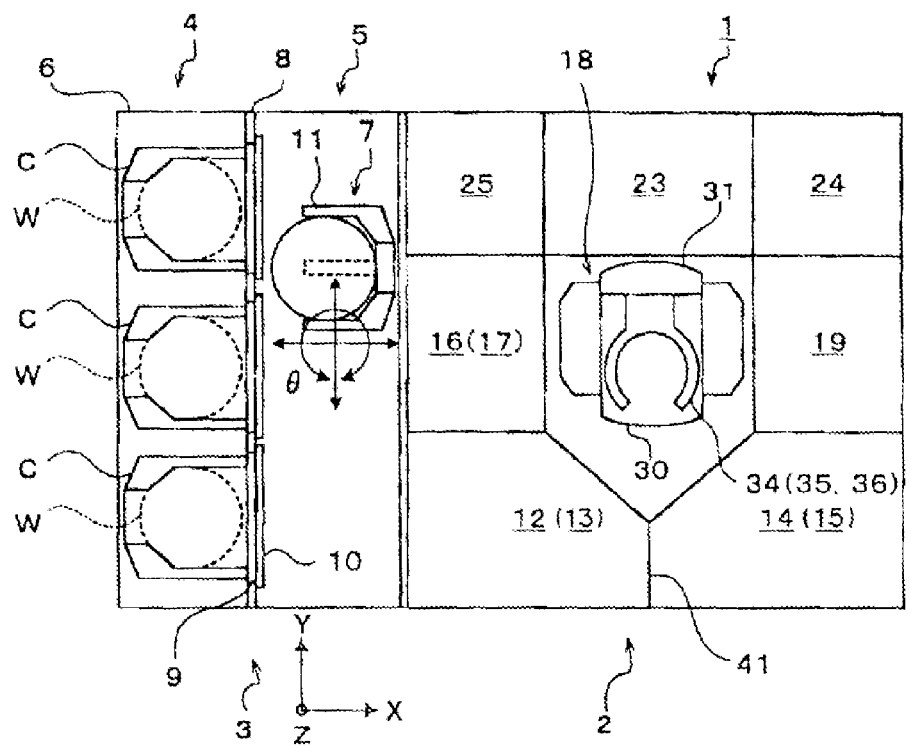
FIG. 1 is a plan view of a substrate processing system.
Figure 2:
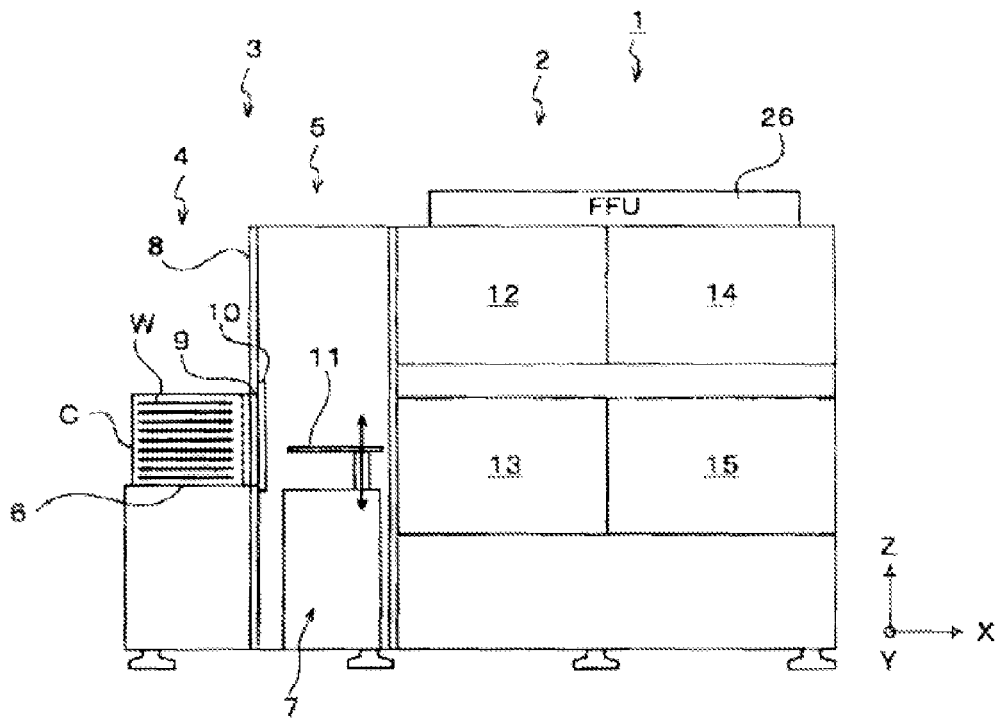
FIG. 2 is a side view of the substrate processing system.

FIG. 1 is a plan view and FIG. 2 is a side view of a substrate processing system 1 containing a processing unit 2 for performing a film removal/cleaning process on wafers W, and a loading/unloading unit 3 for loading/unloading the wafers W into/out of the processing unit 2.

The loading/unloading unit 3 contains an in/out port section 4 that includes mounts 6 for mounting wafer containers (carriers C). The carriers C can accommodate a plurality (e.g., 25) of wafers W that are horizontally positioned in the carriers C with a predetermined vertical spacing between each wafer W. The loading/unloading unit 3 further contains a substrate transfer interface unit 5 that includes a substrate transfer system 7 for transferring the wafers W between the carriers C and the processing unit 2.

The wafers W are loaded into each carrier C through a lid provided on the side of each carrier C. Shelf plates (not shown) for holding the wafers W at the predetermined vertical spacings are provided inside each carrier C, thereby defining a plurality of wafer slots for holding the wafers W. The wafers W are held in the respective wafer slots with the wafer surfaces for microcircuit fabrication facing up.

In FIG. 1, the three carriers C are mounted on the mounts 6 of the in/out port section 4, and arranged in the Y direction with respect to the horizontal plane. The carriers C are mounted with vertical covers (not shown) facing a partition wall 8 between the in/out port section 4 and the substrate transfer interface unit 5. Openings 9 are formed in the partition wall 8 at positions corresponding to the mounted positions of the carriers C. Opening/closing mechanisms 10 for opening/closing the openings 9 are operated by a shutter or other means that are located near the openings 9. The opening/closing mechanisms 10 can also open/close the vertical covers of the carriers C concurrently with the opening/closing of the openings 9. When the openings 9 are opened to couple the wafers W in the carriers C with the substrate transfer interface unit 5, the substrate transfer system 7 couples the substrate transfer interface unit 5 to the carriers C for transferring the wafers W.

The substrate transfer system 7 in the substrate transfer interface unit 5 can be translated in the Y and Z-direction and rotated an angle theta (θ) in the X-Y plane. The substrate transfer system 7 has a transfer arm 11 that can be translated in the X-direction for retrieving a wafer W. The transfer arm 11 can access all the wafer slots located at different elevations in the carriers C when placed on the mount 6. Furthermore, the transfer arm 11 can access upper and lower substrate transfer units 16, 17 located in the processing unit 2 and configured to transfer wafers W from the in/out port section 4 to the processing unit 2 and from the processing unit 2 to the in/out port section 4.

The processing unit 2 contains a central substrate transfer system 18, substrate transfer units 16, 17, substrate processing units 12, 13, 14, 15, and a heating/cooling unit 19 that includes three heating units (not shown) for heating the wafers W and a cooling unit (not shown) for cooling the wafers W. The central substrate transfer system 18 is coupled to the wafer transfer units 16, 17, the substrate processing units 12, 13, 14, 15, and the heating/cooling unit 19.

The processing unit 2 includes an electrical unit 23 that includes an electric power source (not shown) for operating the substrate processing system 1, a mechanical control unit 24 for operational control of the various components of the substrate processing system 1 and the processing system 1 as a whole, a processing liquid storage unit 25 for storing prescribed processing liquids (e.g., cleaning liquids for film removal or rinse liquids for further rinsing) that are utilized in the substrate processing units 12, 13, 14, 15 during wafer W processing. The electrical unit 23 is connected to a main electric power source (not shown). A fan filter unit (FFU) 26 positioned on top of the processing unit 2 provides down flow of clean air to the respective units of the processing unit 2, including the central substrate transfer system 18.

The electrical unit 23, the processing liquid storage unit 25, and the mechanical control unit 24 are arranged on an outer wall in the processing unit 2 for easy removal from the processing unit 2, and easy maintenance of the substrate transfer units 16, 17, the central substrate transfer system 18, and the heating/cooling unit 19.

The substrate transfer units 16, 12 are configured to transfer wafers W to/from the substrate transfer interface unit 5 and stack the wafers W vertically in the two substrate transfer units 16, 17. For example, the (lower) substrate transfer unit 12 can be used to receive a wafer W to be transferred from the in/out port section 4 to the processing unit 2, and the (upper) substrate transfer unit 16 can be used to receive a wafer W to be transferred from the processing unit 2 to the in/out port section 4.

Part of the down flow of clean air from the fan filter unit (FFU) 26 flows to the substrate transfer interface unit 5 through a space between the wafer transfer units 16, 17 and through a space above the substrate transfer unit 16. Thus, the introduction of particles and other contaminants from the substrate transfer interface unit 5 into the processing unit 2 can be minimized and a clean environment maintained in the processing unit 2.

The central substrate transfer system 18 includes a cylindrical support 30 that can be rotated by a rotary drive motor (not shown), and a substrate transfer body 31 that is movable up and down in the Z-direction inside the cylindrical support 30. The substrate transfer body 31 can be rotated within the cylindrical support 30 by the rotation of the cylindrical support 30. The substrate transfer body 31 has three transfer arms 34, 35, 36 that are arranged at different heights and can be independently extended or withdrawn.

The heating/cooling unit 19 contains one cooling unit dedicated for cooling wafers W and three heating units dedicated for heating (or alternatively slow cooling) wafers W. Alternately, the heating/cooling unit 19 may be located in the upper portion of the wafer transfer unit 16, and the space occupied by the heating/cooling unit 19 depicted in FIG. 1 may be utilized for other purposes.

As shown in FIG. 2, the substrate processing units 12, 13, 14, 15 are arranged in two vertical levels, with each level containing two substrate processing units. The substrate processing units 12, 13 and the substrate processing units 14, 15 are symmetrical with respect to the partition 41 between the substrate processing units 12, 13. The substrate processing units 12, 13, 14, 15 may be identical except for their location in the processing unit 2. Below, to illustrate embodiments of the invention, the substrate processing unit 12 is described.

Figure 3:
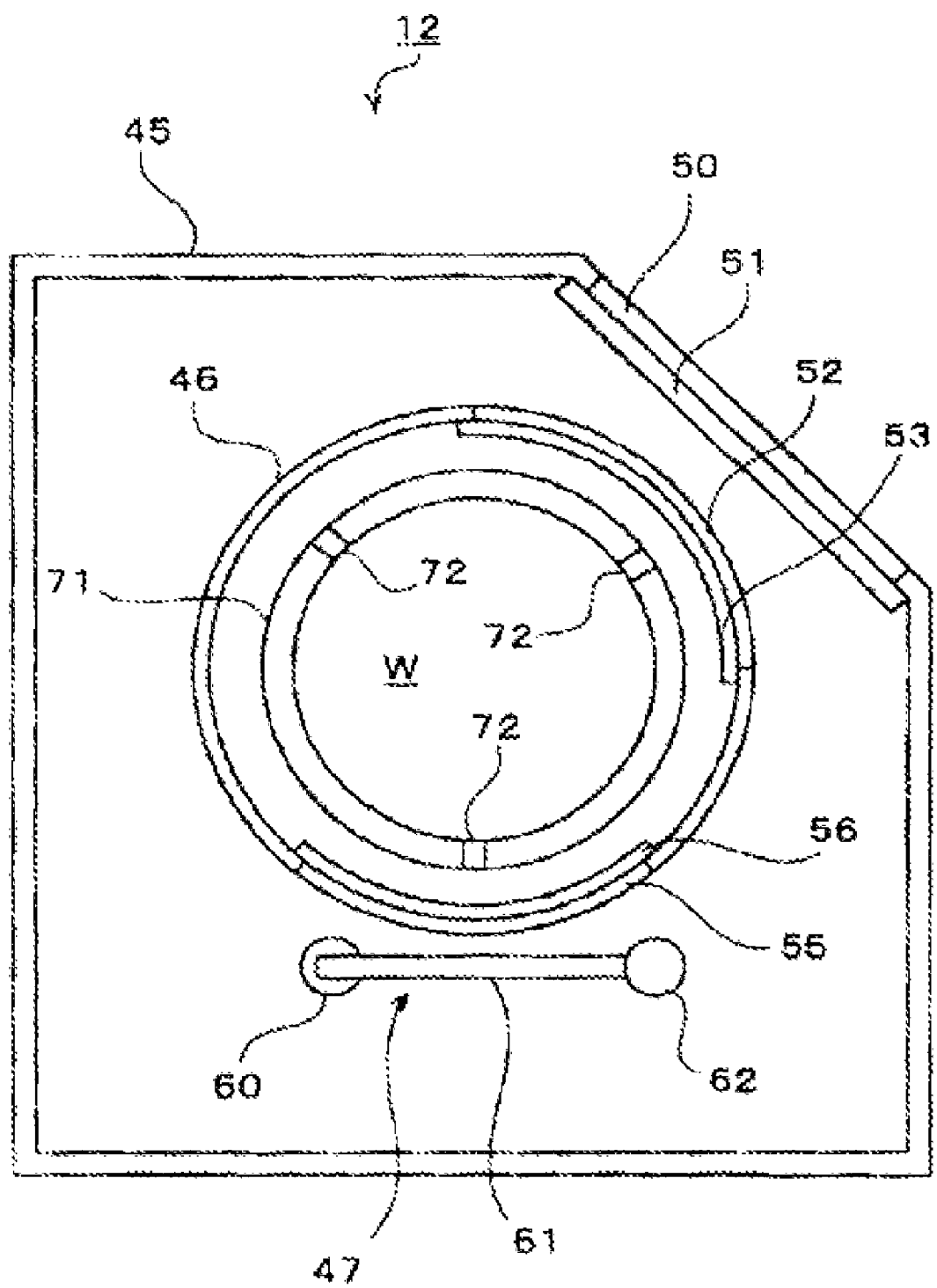
FIG. 3 is a plan view of a substrate processing unit.

FIG. 3 is a plan view of the substrate processing unit 12. The substrate processing unit 12 contains an external chamber 45 and a process chamber 46 within the external chamber 45 for processing wafers W. Furthermore, the external chamber 45 contains a processing liquid supply system 47 for supplying processing liquids to the wafer W in the process chamber 46. An opening 50 is formed in the external chamber 45 and an external chamber mechanical shutter 51 opens/closes the opening 50 using a opening/closing mechanism (not shown). When a wafer W is loaded into the substrate processing unit 12 through the opening 50, an opening 52 is opened by process chamber mechanical shutter 53 to allow transfer of the wafer W into the process chamber 46 by one of the transfer arms 34, 35, 36. The process chamber mechanical shutter 53 may be opened by an opening/closing mechanism that is common with the external chamber mechanical shutter 51. An opening 55 is formed in the process chamber 46 by processing liquid supply shutter 56 which is opened/closed by a drive mechanism (not shown).

The processing liquid supply system 47 provides processing liquids that are applied to the top surface of wafer W. The processing liquids can, for example, include a cleaning liquid for at least partially dissolving a resist film on an exposed surface of the wafer W, or a rinse liquid for further cleaning the wafer W. The processing liquid supply system 47 includes a processing liquid supply nozzle 60, an arm 61 supporting the processing liquid supply nozzle 60, and rotating means 62 for rotatably supporting one end of the arm 61. Thus, the processing liquid supply nozzle 60 is supported by the arm 61 rotatably between a standby position outside the process chamber 46 and a supply position where the processing liquid supply nozzle 60 supplies processing liquids above wafer W. Furthermore, the processing liquid supply nozzle 60 can travel above the wafer W in the process chamber 46, from the center of the wafer W to the edge of the wafer W.

A rotatable chuck 71 is provided for rotatably supporting a wafer W in the process chamber 46. Support pins (not shown) are provided on the upper part of the rotatable chuck 71 at a plurality of positions for supporting the edge of the wafer W from the backside of the wafer W, and retaining members 72 are provided for holding the edge of the wafer W. In the exemplary embodiment shown in FIG. 3, three retaining members 72 are shown.

Figure 4A:
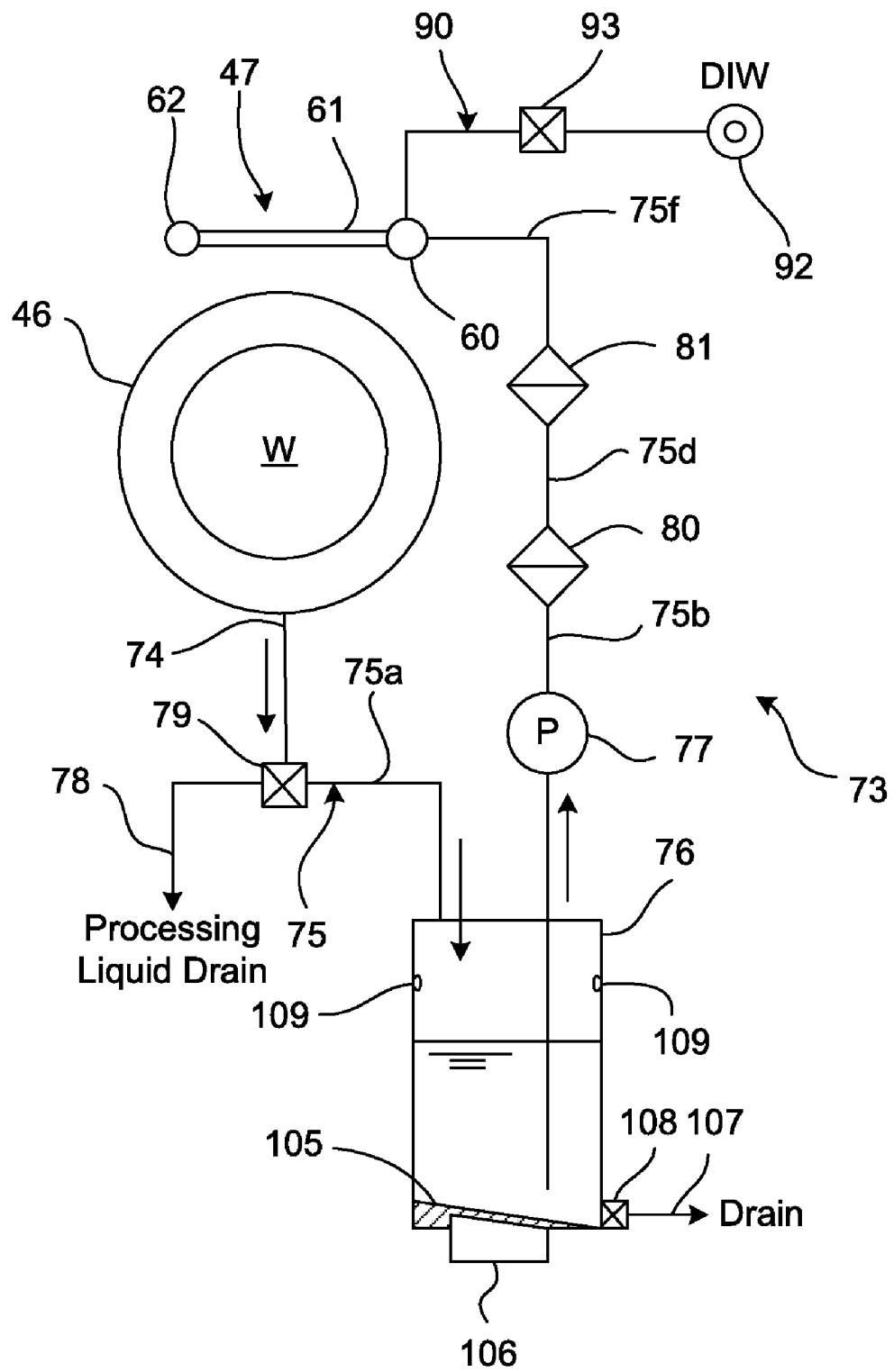
FIG. 4A is a simplified circuit diagram of circulation of a processing liquid in a substrate processing system.

FIG. 4A shows a simplified circuit diagram of circulation of a processing liquid in a substrate processing system, such as system 1, according to an embodiment of the invention. The processing liquid flows through the process chamber 46 in the substrate processing unit 12. The substrate processing unit 12 has a processing liquid circulation system 73 configured for receiving, filtering, and circulating a processing liquid discharged from the process chamber 46 following exposure of the wafer W to the processing liquid. The processing liquid circulation system 73 is connected at one end to a processing liquid discharge line 74 for discharging the processing liquid from the process chamber 46. The processing liquid circulation system 73 is connected at another end to the processing liquid supply nozzle 60 of processing liquid supply system 47. A rinse liquid supply 90 is provided for supplying deionized water (DIW) as a rinse liquid and is connected to the processing liquid supply nozzle 60. The rinse liquid supply 90 is coupled to a rinse liquid supply source 92. A valve 93 is inserted in the rinse liquid supply 90 for controlling the flow of DIW during a rinse process.

A processing liquid circulation line 75 and a processing liquid drain 78 are connected to the processing liquid discharge line 74 by a valve 79 that is configured for controlling the flow of a processing liquid discharged from the process chamber 46 to either the processing liquid drain 78 or to the processing liquid circulation line 75. According to embodiments of the invention, during at least a portion of a substrate cleaning process, the valve 79 directs the processing liquid from the processing liquid discharge line 74 to the processing liquid circulation line 75 and thereafter, at a predetermined time, the valve 79 directs the processing liquid to the liquid drain 78 to minimize flow of a processing liquid containing film fragments and other impurities to the processing liquid circulation line 75.

The processing liquid circulation line 75 includes a line 75a coupling the valve 79 to a processing liquid container 76 for storing processing liquid recovered from the process chamber 46 via the processing liquid circulation line 75. The bottom surface 105 of the processing liquid container 76 is inclined. A vibrator 106 is coupled to the backside of the bottom surface 105 for applying supersonic vibrations to the bottom surface 105. A drain line 107 for draining processing liquid from the processing liquid container 76 is positioned near the lowest point of the inclined bottom surface 105. The drain line 107 is connected to a side surface of the processing liquid container 76 through a valve 108. This setup allows for draining the processing liquid from the processing liquid container 76 through the drain line 107, prior to cleaning the inside of the processing liquid container 76. Spray nozzles 109 positioned on the wall of the processing liquid container 76 are provided for cleaning the inside of the processing liquid container 76. The vibrator 106 applies supersonic vibrations to the bottom surface 105 to release film fragments and other impurities that precipitate and settle on the bottom surface 105. The spray nozzles 109 may spray water to clean the interior of the processing liquid container 76 and subsequently spray vapor of isopropyl alcohol (IPA) to dry the interior of the processing liquid container 76. The water sprayed into the processing liquid container 76 can be drained through the drain line 107.

A pump 77 provides processing liquid flow from the processing liquid container 76 through line 75b to a first (coarse) filter 80 for removing large film fragments from the processing liquid flowing through the processing liquid circulation system 73. The once filtered processing liquid flows through line 75d to a second (fine) filter 81 that is finer than the first filter 80. In one example, the first filter 80 may have pore sizes of 50 microns (micron=10-6 m) and the second filter 81 may have pore sizes of 0.1 microns. The first filter 80 removes larger film fragments from the processing liquid and the second filter 81 substantially removes any remaining smaller film fragments and other impurities from the processing liquid. The presence of the first filter 80 reduces the cleaning/replacing frequency of the second filter 81. In one example, the presence of the first filter 80 in the processing liquid circulation line 75 was observed to decrease the replacement frequency of the second filter 81 by about ⅔. The twice filtered/purified processing liquid is flowed through the line 75f to the processing liquid supply nozzle 60 and applied again to the wafer W or a subsequent wafer W. Although not shown in FIG. 4A, the processing liquid circulation system 73 may contain one or more pressure control devices, one or more flow control devices, additional valves, and one or more flow sensors.

Figure 4B:
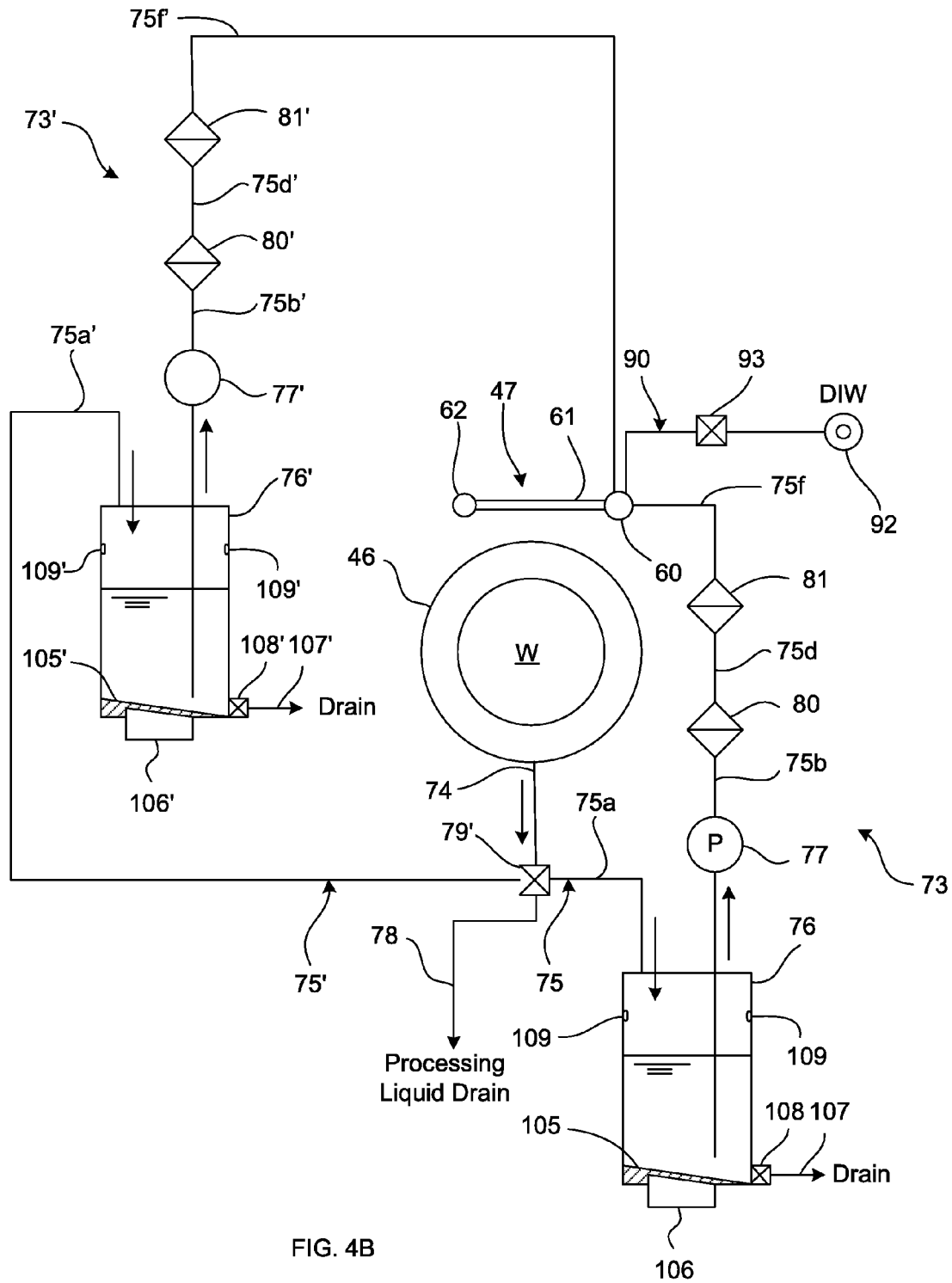
FIG. 4B is a simplified circuit diagram of circulation of first and second processing liquids in a substrate processing system.

FIG. 4B shows a simplified circuit diagram of circulation of first and second processing liquids in a substrate processing system, such as system 1, according to an embodiment of the invention. The circuit diagram of FIG. 4B is similar to the circuit diagram of FIG. 4A but contains first and second processing liquid circulation systems 73 and 73', each configured for separately receiving, filtering, and circulating two processing liquids discharged from the process chamber 46 via the processing liquid discharge line 74 following exposure of the wafer W to the processing liquid. The first and second processing liquid circulation systems 73 and 73' are connected at one end to the processing liquid discharge line 74 configured for discharging a processing liquid from the process chamber 46.

First and second processing liquid circulation lines 75 and 75' and the processing liquid drain 78 are connected to the processing liquid discharge line 74 by a valve 79' that is configured for controlling the flow of a processing liquid discharged from the process chamber 46 to the processing liquid drain 78 or to either of the first and second processing liquid circulation lines 75 and 75'. According to an embodiment of the invention, during at least a portion of a substrate cleaning process, the valve 79' directs a first processing liquid from the processing liquid discharge line 74 to the first processing liquid circulation system 73 and thereafter, at a predetermined time, the valve 79' directs a processing liquid to the liquid drain 78 to minimize the flow of a processing liquid containing film fragments and other impurities to the first processing liquid circulation system 73. Subsequently, the valve 79' can direct a second processing liquid to either the second processing liquid circulation system 73' or to the processing liquid drain 78.

Similar or identical to the first processing liquid circulation line 75, the second processing liquid circulation line 75' is coupled through a line 75a' to a processing liquid container 76' for storing the second processing liquid recovered from the process chamber 46 via the second processing liquid circulation line 75'. The bottom surface 105' of the processing liquid container 76' is inclined. A vibrator 106' is coupled to the backside of the bottom surface 105' for applying supersonic vibrations to the bottom surface 105'. A drain line 107' for draining the second processing liquid from the processing liquid container 76' is positioned near the lowest point of the inclined bottom surface 105'. The drain line 107' is connected to a side surface of the processing liquid container 76' through a valve 108'. This setup allows for draining the second processing liquid from the processing liquid container 76' through the drain line 107', prior to cleaning the inside of the processing liquid container 76'. Spray nozzles 109' positioned on the wall of the processing liquid container 76' are provided for cleaning the inside of the processing liquid container 76'. The vibrator 106' applies supersonic vibrations to the bottom surface 105' to release film fragments and other impurities that precipitate and settle on the bottom surface 105'. The spray nozzles 109' may spray water to clean the interior of the processing liquid container 76' and subsequently spray vapor of IPA to dry the interior of the processing liquid container 76'. The water and IPA sprayed into the processing liquid container 76' can be drained through the drain line 107'.

A pump 77' provides processing liquid flow from the processing liquid container 76' through line 75b' to a first (coarse) filter 80' for removing large film fragments from the second processing liquid flowing through the second processing liquid circulation system 73'. The once filtered second processing liquid flows through line 75d' to a second (fine) filter 81' that is finer than the first filter 80'. The first filter 80' removes larger film fragments from the second processing liquid and the second filter 81' substantially removes any remaining smaller film fragments and other impurities from the second processing liquid. The twice filtered/purified second processing liquid is then flowed through the line 75f' to the processing liquid supply nozzle 60 and applied again to the wafer W or a subsequent wafer W.

As described above in FIGS. 4A and 4B, a plurality of filters may be utilized to remove film fragments and other impurities from a processing liquid in a processing liquid circulation system. However, the processing liquid discharged from the process chamber 46 can contain large amounts of film fragments due to the large number of wafers W processed and the large surface area of the wafers. This results in rapid clogging of at least one filter, which requires frequent cleaning or replacing of the at least one filter. Various methods have been proposed to alleviate this problem, including in-situ cleaning of one or more of the filters. A method and system for in-situ cleaning of one or more filters is described in U.S. Pat. No. 6,861,371. One drawback of in-situ filter cleaning is interruption of the wafer processing during the filter cleaning which results in decreased wafer throughput and increase in the cost of operating the substrate processing system.

Embodiments of the present invention provide a method for increasing the time between filter cleaning/replacing events by reducing the amount of film fragments and other impurities in one or more processing liquids. In particular, during substrate processing, a majority of the film fragments and other impurities along with a portion of a processing liquid is discharged to the processing liquid drain instead of to the processing liquid circulation system, thereby reducing the filter cleaning/replacing frequency.

Figure 5A:
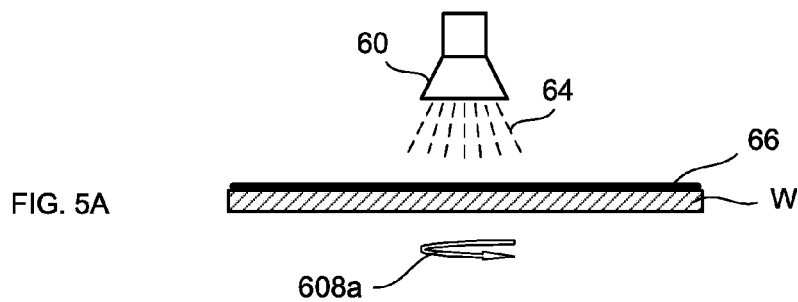
FIGS. 5A-5E schematically show cross-sectional views corresponding to processing steps used in removing a film from a wafer according to an embodiment of the invention.
Figure 5B:
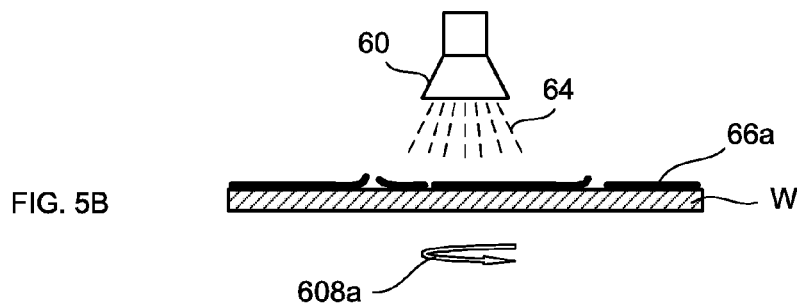
Figure 5C:
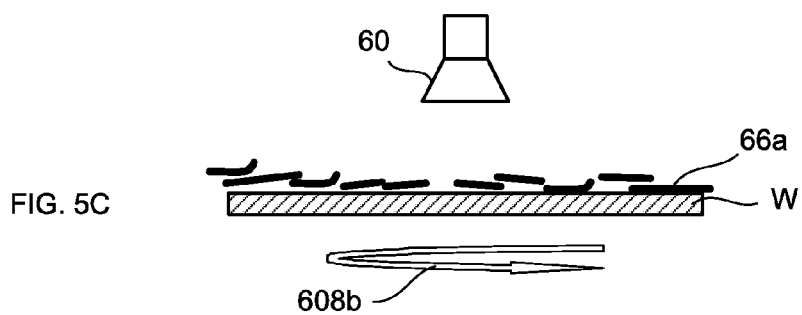
Figure 5D:
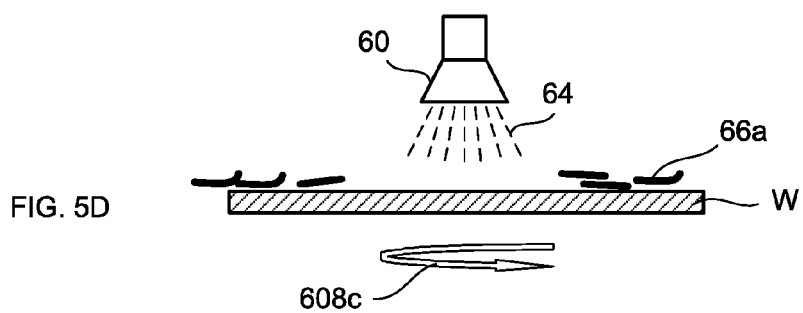
Figure 5E:
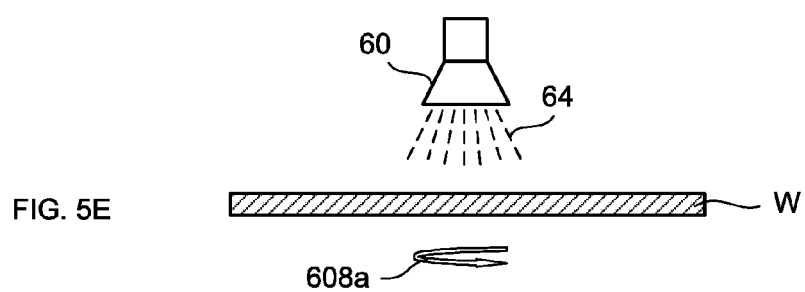
Figure 6:
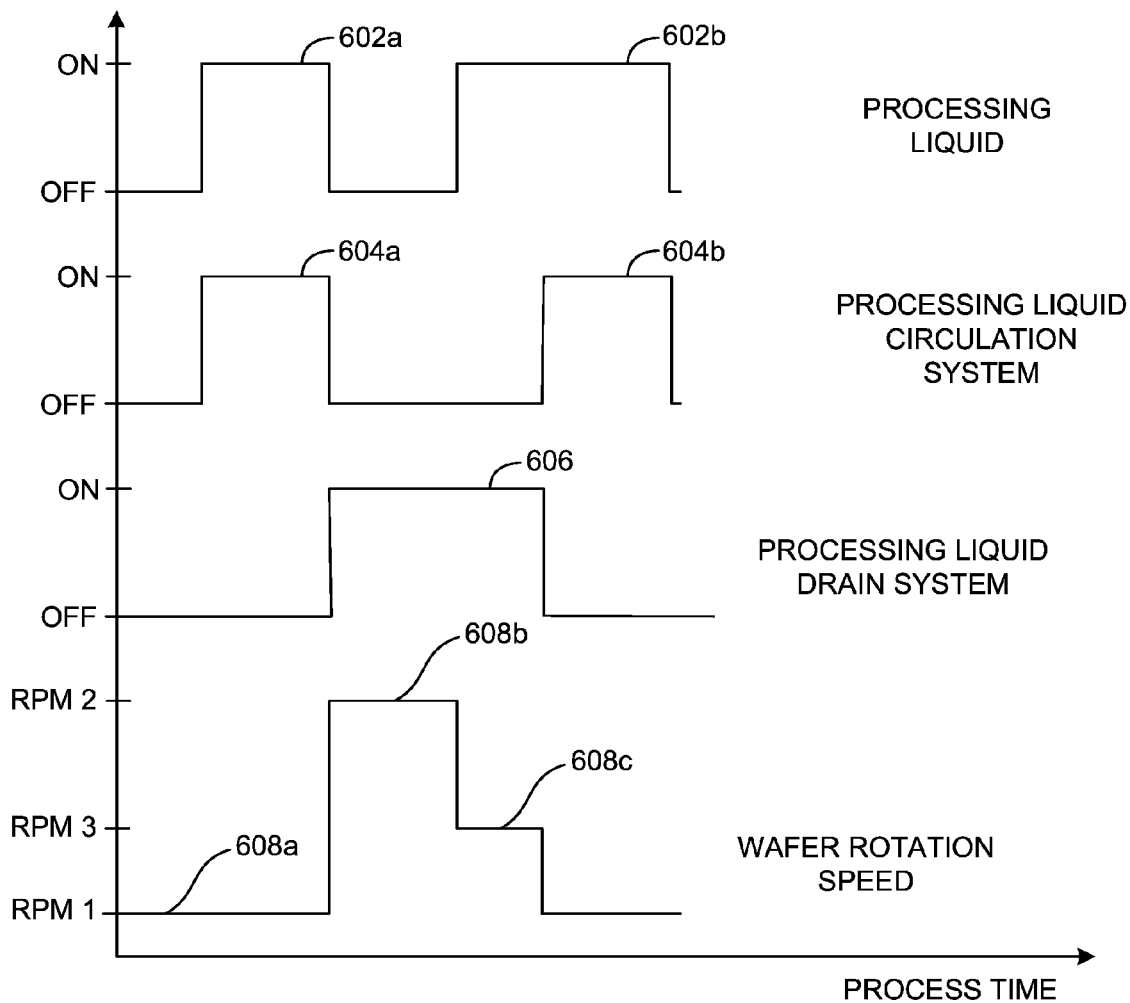
FIG. 6 is a timing diagram for removing a film from a wafer according to an embodiment of the invention.
Figure 7:
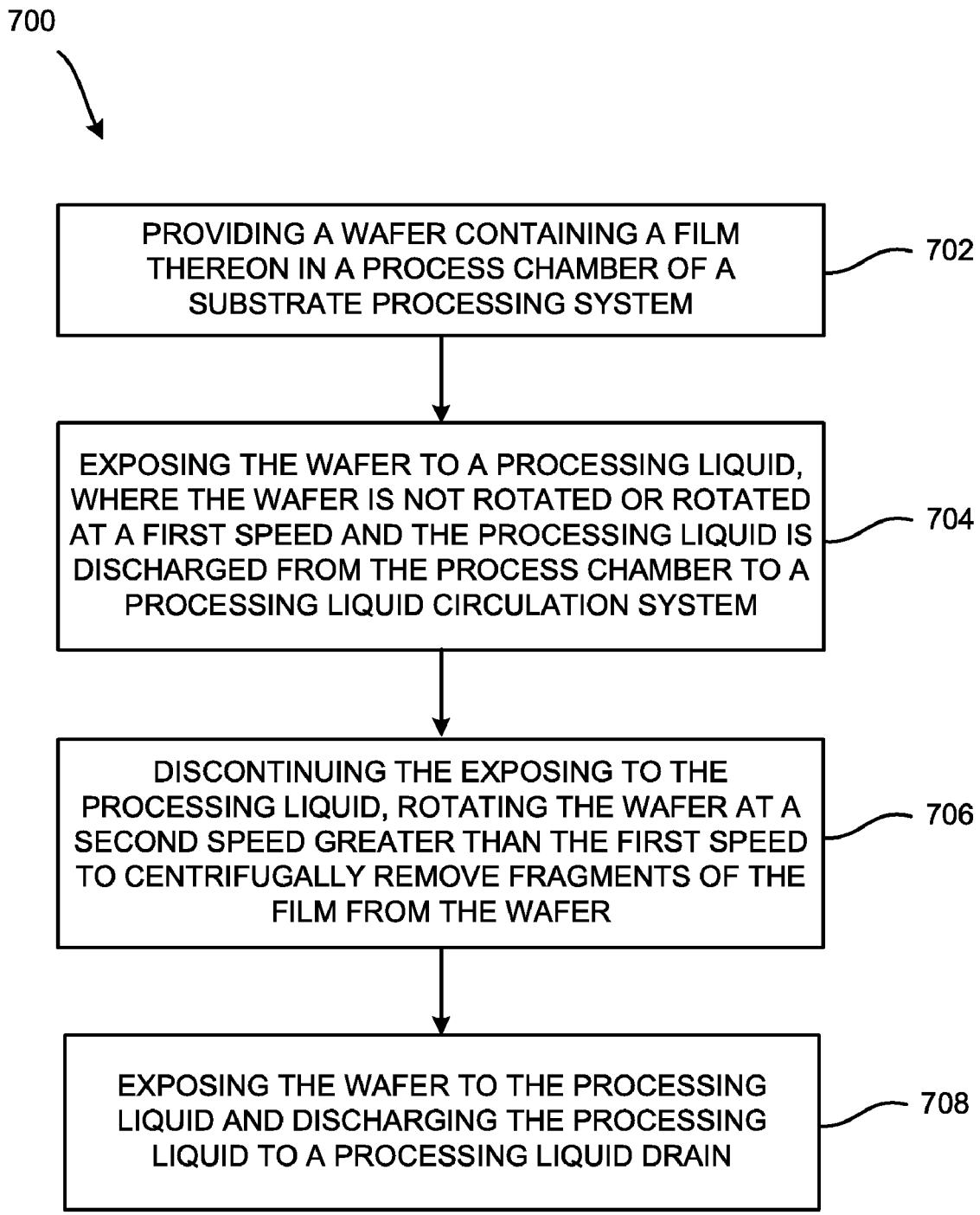
FIG. 7 is a process flow diagram of processing steps used in removing a film from a wafer according to an embodiment of the invention.

Reference will now be made to FIG. 4A, FIGS. 5A-5E, FIG. 6, and FIG. 7 to illustrate an embodiment of the invention. FIGS. 5A-5E schematically show cross-sectional views corresponding to processing steps used in removing a film from a wafer according to an embodiment of the invention. FIG. 6 is a timing diagram for removing a film from a wafer according to an embodiment of the invention. FIG. 7 is a process flow diagram of processing steps used in removing a film from a wafer according to an embodiment of the invention.

In step 702 of the process flow 700, a wafer W containing a film 66 formed thereon is provided in a process chamber of a substrate processing system, for example the process chamber 46 of substrate processing system 1 depicted in FIGS. 1-3.

In step 704, the wafer W is exposed to a processing liquid 64, such as an organic solvent, from the processing liquid supply nozzle 60 for a time period 602a to initiate removal of the film 66 from the wafer W. This is schematically depicted in FIG. 5A. During time period 602a, the wafer W is rotated at a first speed 608a and the processing liquid 64 is discharged from the process chamber 46 to the processing liquid circulation system 73 for a time period 604a. Upon exposure of the wafer W to the processing liquid 64, the film 66 may partially dissolve and form film fragments 66a. This is schematically depicted in FIG. 5B. In one example, plasma exposed (hardened) masks and photoresist etch slowly or not at all in the processing liquid 64. The length of time periods 602a and/or 604a can, for example, be between about 10 sec and about 30 sec. The first speed 608a can, for example, be less than about 30 revolutions per minute (RPM), and can be about 10 RPM. Alternately, the wafer W is not rotated during time period 602a and the first speed 608a is 0 RPM.

In step 706, the exposing of the wafer W to the processing liquid 64 is discontinued and the wafer W is rotated at a second speed 608b greater than the first speed 608a to centrifugally remove the film fragments 66a from the wafer W. This is schematically depicted in FIG. 5C. Furthermore, liquid discharge from the process chamber 46 is changed from the processing liquid circulation system 73 to the processing liquid drain 78. The liquid discharge to the processing liquid drain 78 is carried out for a time period 606. According to one embodiment of the invention, the exposing to the processing liquid 64 may be discontinued when the film 66 starts to fragment but before a substantial amount of the film fragments 66a are detached from the wafer W and discharged from the process chamber 46 to the processing liquid circulation system 73. The predetermined time can, for example, be determined through experimentation that can include examining the level of film fragmentation for varying lengths of the time period 602a. The level of film fragmentation can be examined by removing the wafer W from the process chamber 46 and inspecting the film 66 and film fragments 66a by a microscope, for example a scanning electron microscope (SEM).

Still referring to step 706, the second speed 608b can, for example, between about 100 RPM and about 2000 RPM, and can be about 800 RPM. The second speed 608b can be selected through experimentation to optimize the centrifugal removal of the film fragments 66a from the wafer W.

In step 708, the wafer W is exposed to the processing liquid 64 for a time period 602b and the processing liquid 64 is discharged from the process chamber 46 to the processing liquid drain 78 for the remainder of the time period 606. According to an embodiment of the invention, in addition to the processing liquid 64, a substantial amount of the film fragments 66a detached from the wafer W in the prior step 706 is discharged to the processing liquid drain 78 in step 708, thereby minimizing the amount of the film fragments 66a that are discharged to the processing liquid circulation system 73. This, in turn, results in lower amounts of film fragments 66a and other impurities that can accumulate in the processing liquid container 76 and in the filters 80 and 81. This results in less frequent cleaning or replacing of the one or more filters and less interruption of the wafer processing.

Furthermore, as depicted in FIG. 6, during the time period 602b, the process chamber discharge can be changed from the processing liquid drain 78 to the processing liquid circulation system 73 to recover some of the processing liquid 64. As depicted in FIG. 5D and FIG. 6, the wafer W is rotated at a third speed 608c that is lower than the second speed 608b for a first portion of the time period 602b. Subsequently, the wafer W is rotated at the first speed 608a for a second portion of the time period 602b. This is schematically depicted in FIG. 5E. The third speed 608c can, for example, be between about 100 RPM and about 800 RPM, and can be about 200 RPM.

According to the embodiment depicted in FIG. 6, the processing liquid exposed to the substrate during time periods 602a and 602b contains or consists of the same processing liquid, for example, an organic solvent.

Although the end of time period 604a in FIG. 6 is depicted as coinciding with the end of time period 602a, this is not required for embodiments of the invention. In one example, the time period 604a may end after the end of time period 602a in order to recover more of the processing liquid 64 in the processing liquid circulation system 73. In general, in other embodiments of the invention, the time period where a processing liquid is discharged to a processing liquid circulation system may end later than the time period for exposure of a wafer W to the processing liquid.

After exposure of the wafer W to the processing liquid 64 in step 708, processing liquid remnants and other impurities may be present on the wafer W. Therefore, further processing steps may be performed, for example, a variety of DIW exposures, alcohol (e.g., IPA) exposures, and/or $N_2$ gas exposures, to further rinse and dry the wafer W.

Figure 8A:
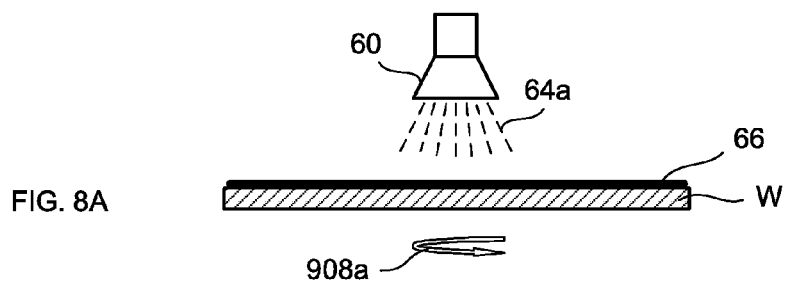
FIGS. 8A-8E schematically show cross-sectional views corresponding to processing steps used in removing a film from a wafer according to another embodiment of the invention.
Figure 8B:
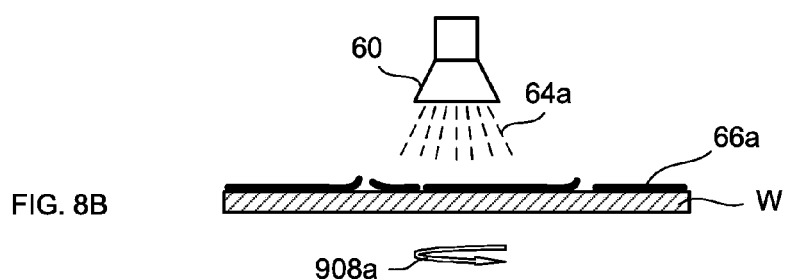
Figure 8C:
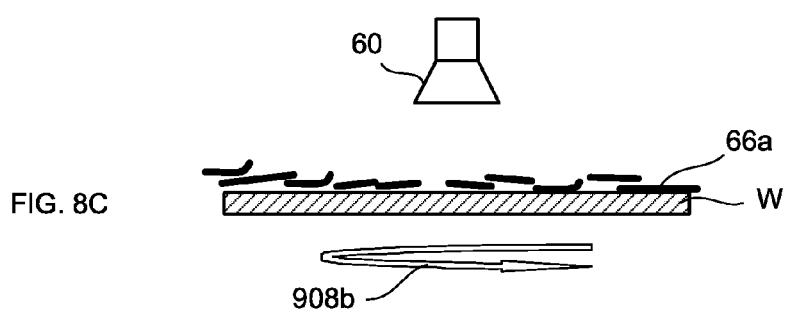
Figure 8D:
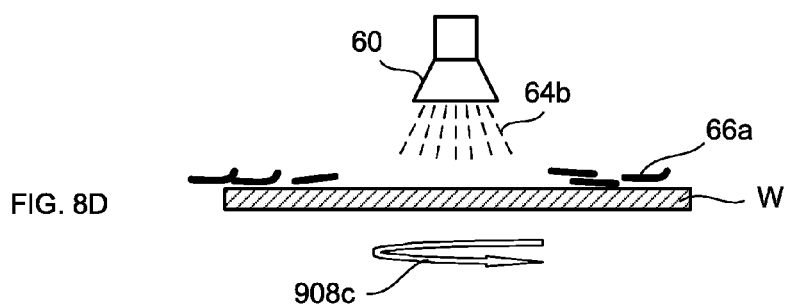
Figure 8E:
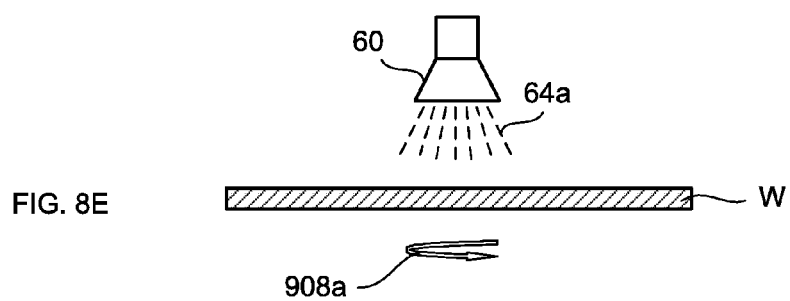
Figure 9:
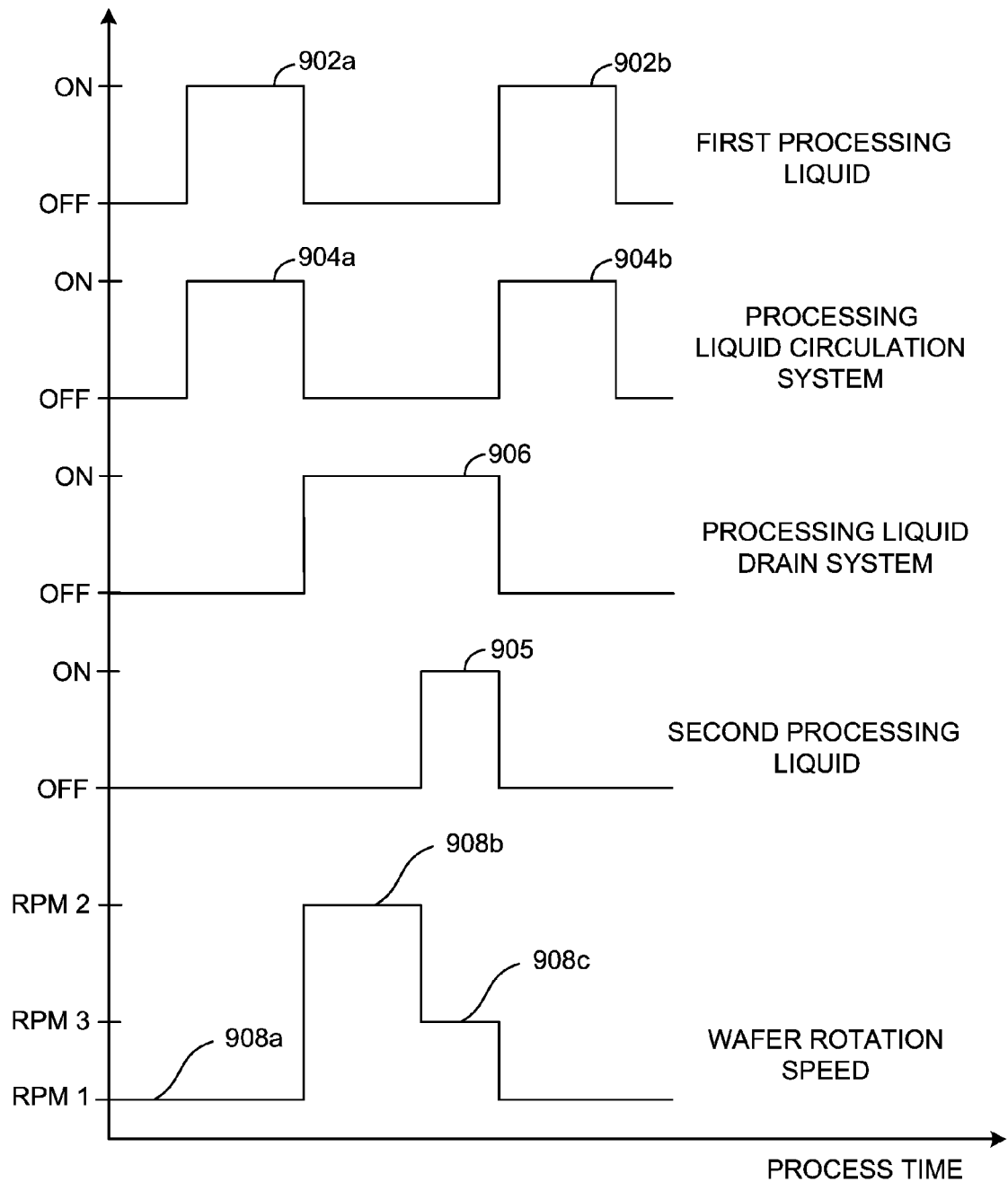
FIG. 9 is a timing diagram for removing a film from a wafer according to another embodiment of the invention.
Figure 10:
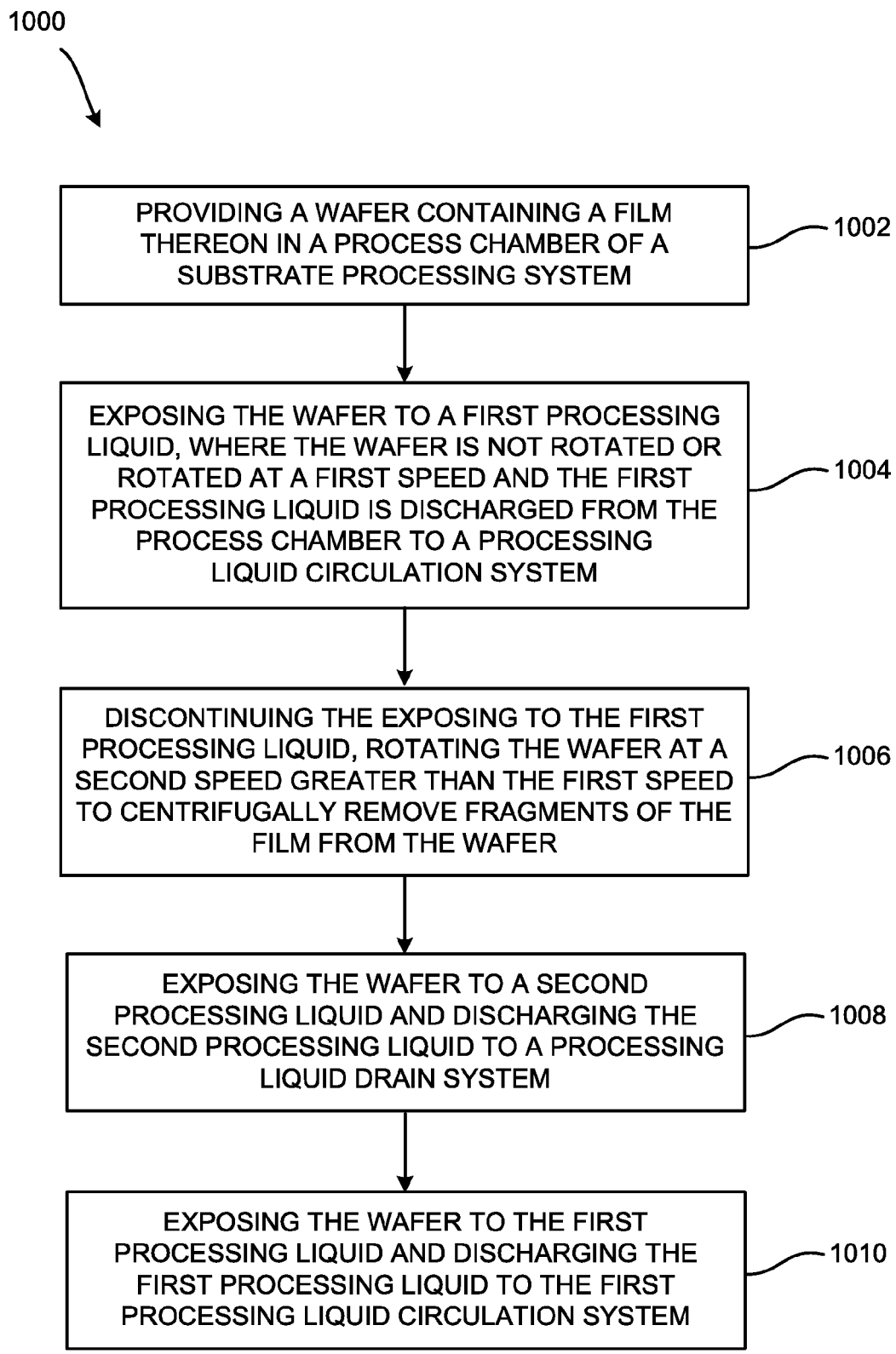
FIG. 10 is a process flow diagram of processing steps used in removing a film from a wafer according to another embodiment of the invention.

Reference will now be made to FIG. 4A, FIGS. 8A-8E, FIG. 9, and FIG. 10 to illustrate another embodiment of the invention. FIGS. 8A-8E schematically show cross-sectional views corresponding to processing steps used in removing a film from a wafer according to an embodiment of the invention. FIG. 9 is a timing diagram for removing a film from a wafer according to an embodiment of the invention. FIG. 10 is a process flow diagram of processing steps used in removing a film from a wafer according to an embodiment of the invention.

In step 1002 of the process flow 1000, a wafer W containing a film 66 formed thereon is provided in a process chamber of a substrate processing system, for example the process chamber 46 of substrate processing system 1 depicted in FIGS. 1-3.

In step 1004, the wafer W is exposed to a first processing liquid 64a, such as an organic solvent, from the processing liquid supply nozzle 60 for a time period 902a to initiate removal of the film 66 from the wafer W. This is schematically depicted in FIG. 8A. During the time period 902a, the wafer W is rotated at a first speed 908a and the first processing liquid 64a is discharged from the process chamber 46 to the processing liquid circulation system 73 for a time period 904a. Upon exposure of the wafer W to the first processing liquid 64a, the film 66 may partially dissolve and form film fragments 66a. This is schematically depicted in FIG. 8B. The length of time periods 902a and/or 904a can, for example, be between about 10 sec and about 30 sec. The first speed 908a can, for example, be less than about 30 RPM, and can be about 10 RPM. Alternately, the wafer W is not rotated during time period 902a and the first speed 908a is 0 RPM.

In step 1006, the exposing of the wafer W to the first processing liquid 64a is discontinued and the wafer W is rotated at a second speed 90% greater than the first speed 908a to centrifugally remove the film fragments 66a from the wafer W. This is schematically depicted in FIG. 5C. Furthermore, liquid discharge from the process chamber 46 is changed from the processing liquid circulation system 73 to the processing liquid drain 78. The liquid discharge to the processing liquid drain 28 is carried out for a time period 906. According to one embodiment of the invention, the exposing to the first processing liquid 64a may be discontinued when the film starts to fragment but before a substantial amount of the film fragments 66a are detached from the wafer W and discharged from the process chamber 46 to the processing liquid circulation system 73.

Still referring to step 1006, the second speed 908b can, for example, between about 100 RPM and about 2000 RPM, and can be about 800 RPM. The second speed 908b can be selected through experimentation to optimize the centrifugal removal of the film fragments 66a from the wafer W.

In step 1008, the wafer W is exposed to a second processing liquid 64b for a time period 905 and the processing liquid 64b is discharged from the process chamber 46 to the processing liquid drain 78 for the remainder of time period 906. The second processing liquid 64b can be, for example, a rinse liquid such as DIW or an alcohol, or an organic solvent of a different type or concentration than a solvent in the first processing liquid 64a. According to an embodiment of the invention, in addition to the second processing liquid 64b, a substantial amount of the film fragments 66a detached from the wafer W in the prior step 906 is discharged to the processing liquid drain 78 in step 1008, thereby minimizing the amount of the film fragments 66a that are discharged to the processing liquid circulation system 73. This, in turn, results in lower amounts of film fragments 66a that can accumulate in the processing liquid container 79 and in the filters 80 and 81. As depicted in FIG. 8D and FIG. 9, the wafer W is rotated at a third speed 908c that is lower than the second speed 908b during time period 905. The third speed 908c can, for example, be between about 100 RPM and about 800 RPM, and can be about 200 RPM.

In step 1010, the wafer W is exposed again to the first processing liquid 64a for a time period 902b and the processing liquid 64a is discharged from the process chamber 46 to the processing liquid circulation system 73 for a time period 904b. This is schematically depicted in FIG. 8E. The wafer W is again rotated at the first speed 908a, which can be, for example, less than 30 RPM or 0 RPM.

After exposure of the wafer W to the first processing liquid 64a in step 1010, remnants of the first and second processing liquids and other impurities may be present on the wafer W. Therefore, additional processing steps may be performed, for example, a variety of DIW exposures, alcohol (e.g., IPA) exposures, and/or $N_2$ gas exposures, to further rinse and dry the wafer W.

Figure 11A:
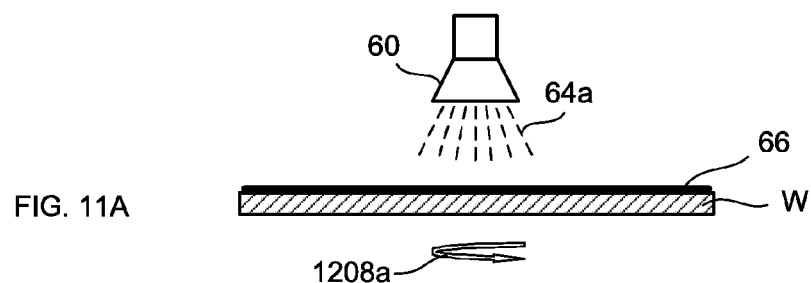
FIGS. 11A-11E schematically show cross-sectional views corresponding to processing steps used in removing a film from a wafer according to yet another embodiment of the invention.
Figure 11B:
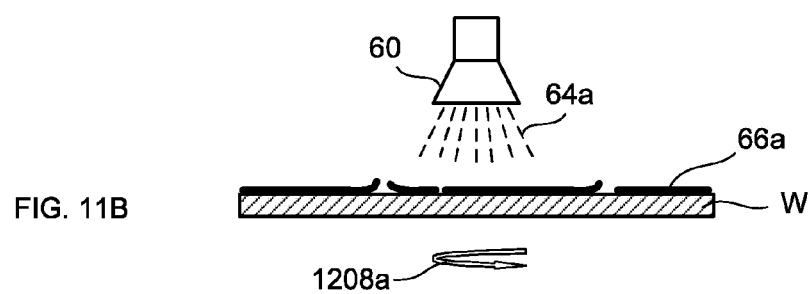
Figure 11C:
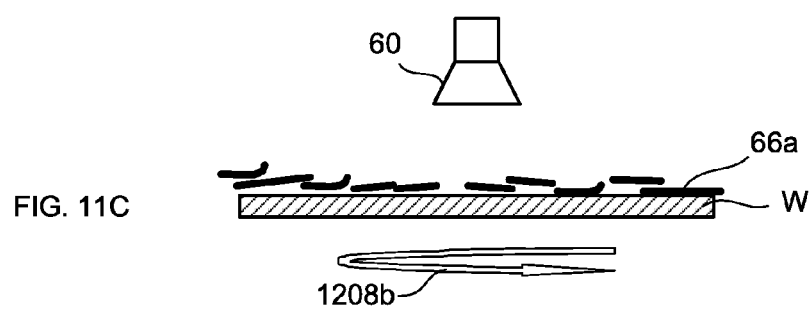
Figure 11D:
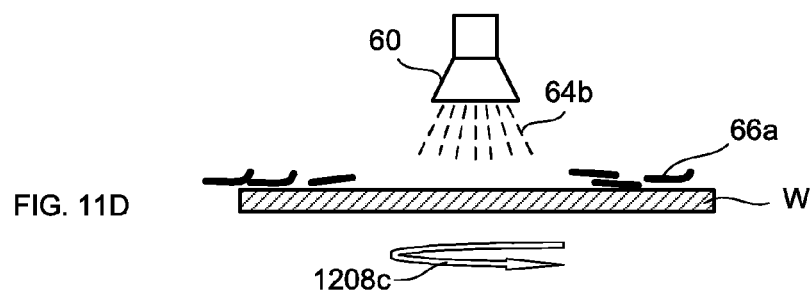
Figure 11E:
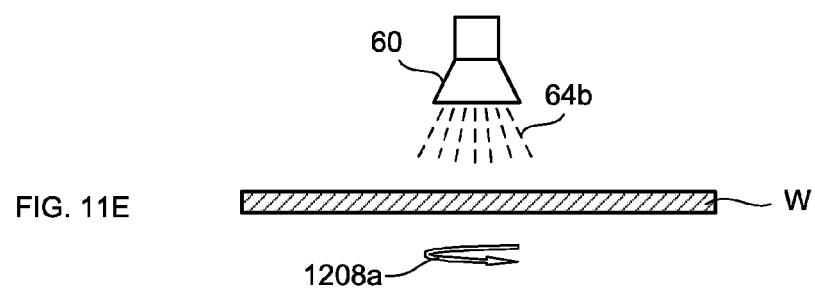
Figure 12:
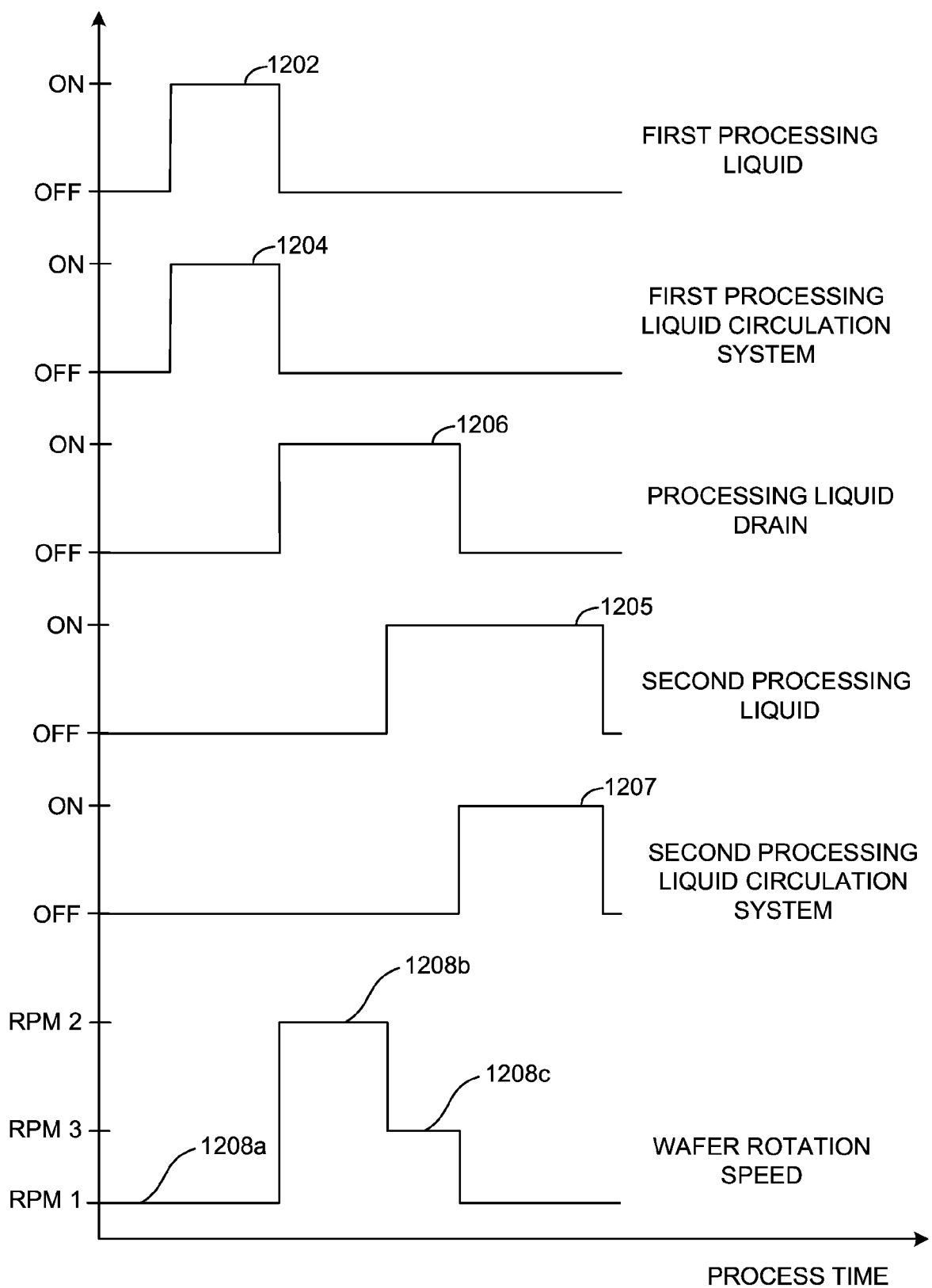
FIG. 12 is a timing diagram for removing a film from a wafer according to yet another embodiment of the invention.
Figure 13:
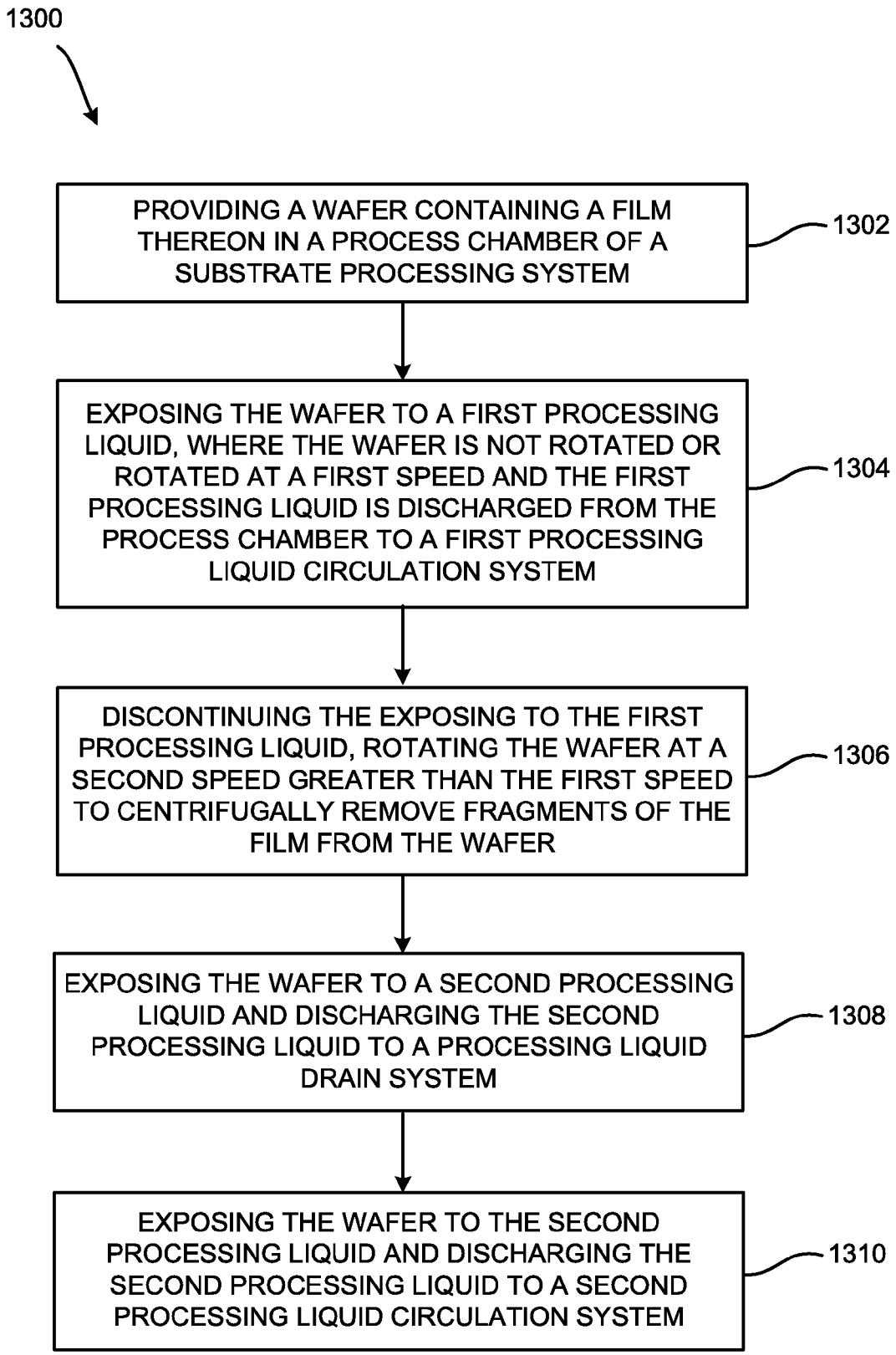
FIG. 13 is a process flow diagram of processing steps used in removing a film from a wafer according to yet another embodiment of the invention.

Reference will now be made to FIG. 4B, FIGS. 11A-11E, FIG. 12, and FIG. 13 to illustrate yet another embodiment of the invention. FIGS. 11A-11E schematically show cross-sectional views corresponding to processing steps used in removing a film from a wafer according to an embodiment of the invention. FIG. 12 is a timing diagram for removing a film from a wafer according to an embodiment of the invention. FIG. 13 is a process flow diagram of processing steps used in removing a film from a wafer according to an embodiment of the invention.

In step 1302 of the process flow 1300, a wafer W containing a film 66 formed thereon is provided in a process chamber of a substrate processing system, for example the process chamber 46 of substrate processing system 1 depicted in FIGS. 1-3.

In step 1304, the wafer W is exposed to a first processing liquid 64a, such as an organic solvent, from the processing liquid supply nozzle 60 for a time period 1202 to initiate removal of the film 66 from the wafer W. This is schematically depicted in FIG. 11A. The wafer W is rotated at a first speed 1208a and the first processing liquid 64a is discharged from the substrate chamber 46 to the first processing liquid circulation system 73 for a time period 1204. Upon exposure of the wafer W to the first processing liquid 64a, the film 66 may partially dissolve and form film fragments 66a. This is schematically depicted in FIG. 11B. The length of time periods 1202 and/or 1204 can, for example, be between about 10 sec and about 30 sec. The first speed 1208a can, for example, be less than about 30 RPM, and can be about 10 RPM. Alternately, the wafer W is not rotated during time period 1202 and the first speed 1208a is 0 RPM.

In step 1306, the exposing of the wafer W to the processing liquid 64a is discontinued and the wafer W is rotated at a second speed 1208b greater than the first speed 1208a to centrifugally remove the film fragments 66a from the wafer W. This is schematically depicted in FIG. 11C. Furthermore, liquid discharge from the process chamber 46 is changed from the first processing liquid circulation system 73 to the processing liquid drain 78. The liquid discharge to the processing liquid drain 78 is carried out for a time period 1206. According to one embodiment of the invention, the exposing to the first processing liquid 64a may be discontinued when the film starts to fragment but before a substantial amount of the film fragments 66a are detached from the wafer W and discharged from the process chamber 46 to the first processing liquid circulation system 73.

Still referring to step 1306, the second speed 1208b can be, for example, between about 100 RPM and about 2000 RPM, and can be about 800 RPM. The second speed 1208b can be selected through experimentation to optimize the centrifugal removal of the film fragments 66a from the wafer W.

In step 1308, the wafer W is exposed to a second processing liquid 64b for a time period 1205 and the second processing liquid 64b is discharged from the process chamber 46 to the processing liquid drain 78 for a first portion of the time period 1205. Similar to step 1008, the second processing liquid can be, for example, a rinse liquid or another organic solvent. According to an embodiment of the invention, in addition to the second processing liquid 64b, a substantial amount of the film fragments 66a detached from the wafer W in the prior step 1306 is discharged to the processing liquid drain 78 in step 1308, thereby minimizing the amount of the film fragments 66a that are discharged to the first and second processing liquid circulation systems 73, 73'. This, in turn, results in lower amounts of film fragments 66a that can accumulate in the processing liquid containers 76, 76' and in the filters 80, 80' and 81, 81'. As depicted in FIG. 11D and FIG. 12, the wafer W is rotated at a third speed 1208c that is lower that the second speed 1208b during the first portion of time period 1205. The third speed 1208c can, for example, be between about 100 RPM and about 800 RPM, and can be about 200 RPM.

In step 1310, the wafer W continues to be exposed to the second processing liquid 64b for a second portion of time period 1205, but now the second processing liquid 64b is discharged from the process chamber 46 to the second processing liquid circulation system 73' for a time period 1207. During time period 1207, the wafer W is again rotated at the first speed 1208a, which can be, for example, less than 30 RPM or 0 RPM.

After exposure of the wafer W to the second processing liquid 64b in step 1310, remnants of the first and second processing liquids and other impurities may still be present on the wafer W. For example, further processing steps may include a variety of DIW exposures, alcohol (e.g., IPA) exposures, and/or $N_2$ gas exposures, to further rinse and dry the wafer W.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method for removing a film from a wafer in a substrate processing system, the method comprising the steps of:
   a) exposing the wafer in a process chamber of the substrate processing system to a first processing liquid, wherein the wafer is rotated at a first speed and the first processing liquid is discharged from the process chamber to a first processing liquid circulation system;
   b) discontinuing the exposing of the wafer to the first processing liquid and rotating the wafer at a second speed greater than the first speed while changing the process chamber discharge from the first processing liquid circulation system to a processing liquid drain; and
   c) exposing the wafer to a second processing liquid and discharging the second processing liquid to the processing liquid drain, wherein fragments of the film on the wafer are removed at least when the wafer is rotating at the second speed.

2. The method according to claim 1, further comprising:
d) exposing the wafer to the first processing liquid and discharging the first processing liquid from the process chamber to the first processing liquid circulation system.

3. The method according to claim 1, wherein the film comprises a resist film, a mask, a dielectric film, or a combination thereof.

4. The method according to claim 1, wherein the first processing liquid comprises an organic solvent.

5. The method according to claim 1, further comprising:
d) exposing the wafer to the second processing liquid and discharging the second processing liquid from the process chamber to a second processing liquid circulation system.

6. The method according to claim 1, wherein changing the process chamber discharge from the first processing liquid circulation system to the processing liquid drain in b) is performed before the wafer is exposed to the second processing liquid in c).

7. The method according to claim 1, wherein step b) is conducted at a predetermined time that is based on when the film starts to fragment but before a substantial amount of the film fragments are detached from the wafer and discharged from the process chamber to the first processing liquid circulation system.

8. The method according to claim 2, wherein step d) further comprises:
rotating the wafer at the first speed.

9. The method according to claim 2, wherein step d) further comprises:
rotating the wafer at a speed slower than the second speed.

10. The method according to claim 5, wherein the second processing liquid comprises deionized water (DIW) or an alcohol.

11. A method for removing a film from a wafer in a substrate processing system, the method comprising the steps of:
a) exposing the wafer in a process chamber of the substrate processing system to a first processing liquid, wherein the wafer is rotated at a first speed and the first processing liquid is discharged from the process chamber to a first processing liquid circulation system;
b) discontinuing the exposing of the wafer to the first processing liquid and rotating the wafer at a second speed greater than the first speed while changing the process chamber discharge from the first processing liquid circulation system to a processing liquid drain;
c) exposing the wafer to a second processing liquid and discharging the second processing liquid from the process chamber to processing liquid drain;
d) changing the process chamber discharge from the processing liquid drain to the first processing liquid circulation system; and
e) exposing the wafer to the first processing liquid and discharging the first processing liquid from the process chamber to the first processing liquid circulation system, wherein fragments of the film on the wafer are removed at least when the wafer is rotating at the second speed.

12. The method according to claim 11, wherein the film comprises a resist film, a mask, a dielectric film, or a combination thereof.

13. The method according to claim 11, wherein the first processing liquid comprises an organic solvent.

14. A method for removing a film from a wafer in a substrate processing system, the method comprising the steps of:
a) exposing the wafer in a process chamber of the substrate processing system to a first processing liquid, wherein the wafer is rotated at a first speed and the first processing liquid is discharged from the process chamber to a first processing liquid circulation system;
b) discontinuing the exposing of the wafer to the first processing liquid and rotating the wafer at a second speed greater than the first speed while changing the process chamber discharge from the first process liquid circulation system to a processing liquid drain;
c) exposing the wafer to a second processing liquid and discharging the second processing liquid from the process chamber to the processing liquid drain;
d) changing the process chamber discharge from the processing liquid drain to a second processing liquid circulation system; and
e) exposing the wafer to the second processing liquid and discharging the second processing liquid from the process chamber to the second processing liquid circulation system, wherein fragments of the film on the wafer are removed at least when the wafer is rotating at the second speed.

15. The method according to claim 14, wherein step e) further comprises:
rotating the wafer at the first speed.

16. The method according to claim 14, wherein the film comprises a resist film, a mask, a dielectric film, or a combination thereof.

17. The method according to claim 14, wherein the first processing liquid comprises an organic solvent.

* * * * *